US006784007B2

(12) United States Patent
Iwasaki et al.

(10) Patent No.: US 6,784,007 B2
(45) Date of Patent: Aug. 31, 2004

(54) NANO-STRUCTURES, PROCESS FOR PREPARING NANO-STRUCTURES AND DEVICES

(75) Inventors: Tatsuya Iwasaki, Machida (JP); Tohru Den, Setagaya-ku (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/252,395

(22) Filed: Sep. 24, 2002

(65) Prior Publication Data

US 2003/0020060 A1 Jan. 30, 2003

Related U.S. Application Data

(62) Division of application No. 09/553,857, filed on Apr. 21, 2000, now Pat. No. 6,476,409.

(30) Foreign Application Priority Data

Apr. 27, 1999 (JP) ............................................ 11-119102
Mar. 30, 2000 (JP) ...................................... 2000-093129

(51) Int. Cl.⁷ ............................................. H01L 21/00
(52) U.S. Cl. ......................... 438/22; 438/707; 438/746
(58) Field of Search ........................... 438/22, 707, 746

(56) References Cited

U.S. PATENT DOCUMENTS 5,420,446 A  5/1995 Narui et al. ................ 257/103
5,587,593 A  12/1996 Koide et al. ................. 257/94
6,139,713 A  10/2000 Masuda et al. ............. 205/206
6,359,288 B1 * 3/2002 Ying et al. .................... 257/14

FOREIGN PATENT DOCUMENTS

| EP | 931859 | 7/1999 |
| JP | 8-246190 | 9/1996 |
| JP | 10-121292 | 5/1998 |
| WO | 98/09005 | 3/1998 |

OTHER PUBLICATIONS

J.D. Joannopoulos, et al., Photonic Crystals, Princeton University Press, Princeton, New Jersey, pp. 54–77 and 94–104 (1995).

R.C. Furneaux, et al., "The formation of controlled–porosity membranes from anodically oxidized aluminum", Nature, vol. 337, pp. 147–149 (1989).

H. Masuda, Solid State Physics, vol. 31, No. 5, pp. 493–499 (1996).

H. Masuda, et al., "Fabication of Gold Nanodot Array Using Anodic Porous Alumina as an Evaporation Mask", Jpn. J.Appl. Phys., vol. 35, part 2, No. 1B, pp. L126–L129 (1996).

* cited by examiner

Primary Examiner—Amir Zarabian
Assistant Examiner—Pamela E Perkins
(74) Attorney, Agent, or Firm—Fitzpatrick, Cella, Harper & Scinto

(57) ABSTRACT

The present invention provides a nano-structure which can be applied to various high-function devices. The nano-structure includes an anodically oxidized layer having a plurality of kinds of pores.

14 Claims, 7 Drawing Sheets

NANO-STRUCTURES, PROCESS FOR PREPARING NANO-STRUCTURES AND DEVICES

This application is a division of application Ser. No. 09/553,857, filed Apr. 21, 2000, Now U.S. Pat. No. 6,476,409

BACKGROUND OF THE INVENTION

1. Field of the Invention

The present invention relates to nano-structures and devices using the same, and a process for preparing the nano-structures. Particularly, the present invention relates to nano-structures having pores, which is believed to be widely used as, for example, electronic and optical devices, functional materials for micro-devices, structural materials, etc., devices using the nano-structures, and a process for preparing the nano-structures.

2. Description of the Related Art

Some thin films, wires and dots of metals or semiconductors, which have sizes smaller than a certain length, exhibit specific electrical, optical and chemical properties due to enclosure of electron movement. From this viewpoint, materials (referred to as "nano-structures" hereinafter) having a fine structure of several 100 nm or less have increasingly attracted attention as functional materials.

An example of processes for preparing such nano-structures comprises preparing a nano-structure directly by a semiconductor processing technique such as a patterning technique such as photolithography, electron beam exposure, X-ray exposure, or the like.

Besides this preparing process, an attempt is made to realize a novel nano-structure comprising a regular structure naturally formed, i.e., a structure formed in a self-ordering manner, as a base. This process can possibly produce a specific fine structure superior to structures produced by conventional processes depending upon the fine structure used as the base, and thus many studies have been conducted.

An example of such a self-ordering process is anodic oxidation which can easily produce a nano-structure having pores in nano-size with high controllability. For example, anodic porous alumina formed by anodically oxidizing aluminum or an alloy thereof in an acidic bath is known.

Anodic oxidation of an Al plate in an acidic electrolyte forms a porous oxide film (anodic porous alumina) (refer to, for example, R C. Furneaux, W. R. Rigby & A. P. Davids on NATURE Vol. 337, P147 (1989)). The porous oxide film is characterized by having a specific geometric structure in which very fine cylindrical pores (nano-holes) having a diameter of several nm to several hundreds nm are arranged in parallel at intervals (cell size) of several nm to several hundreds nm. The cylindrical pores have a high aspect ratio, and are excellent in uniformity of the sectional diameter. The diameter and interval of the pores can be controlled to some extent by controlling the current and voltage in anodic oxidation, and the thickness of the oxide film and the depth of the pores can be controlled to some extent by controlling the anodic oxidation time.

In order to improve the perpendicularity, linearity, and independence of the pores of the anodic porous alumina, a two-step anodic oxidation process has been proposed, in which after a porous oxide film formed by anodic oxidation is removed, anodic oxidation is again performed to form anodic porous alumina (ordered alumina nanohole) having pores having good perpendicularity, linearity and independence (Jpn. Journal of Applied Physics, Vol. 35, Part 2, No. 1B, pp. L126–L129, Jan. 15, 1996). This process utilizes the property that surface concaves of an aluminum plate formed by removing the anodic oxide film formed by first anodic oxidation serve as the starting points of pore formation in second anodic oxidation.

Besides these processes, the process of forming pore starting points by using press pattering has also be proposed, in which a substrate having a surface comprising a plurality of convexes is pressed on the surface of an aluminum plate to form concaves as pore starting points, and then anodic oxidation is performed to form a porous oxide film having pores exhibiting good shapes, interval and pattern controllability (Japanese Patent Laid-Open No. 10-121292).

In consideration of the specific geometric structure of the anodic porous alumina, various applications are attempted. Although this is explained in detail by Masuda, examples of application are described below. Examples of applications include applications to films using the anodically oxidized film having abrasion resistance and insulation resistance, applications to filters using separated films, etc. Furthermore, various other applications to coloring, magnetic recording media, EL light emitting devices, electrochromic devices, optical devices, gas sensors, etc., are attempted by using the technique of filling nano-holes with a metal, a semiconductor, or the like, and the technique of replicating the nano-hole structures. Furthermore, applications to various fields of quantum fine wires, quantum effect devices such as a MIM device, a molecular sensor using nano-holes as chemical reaction fields, etc. are expected (Masuda, Solid State Physics, 31, 493 (1996)).

Since the above-mentioned direct preparation of nano-structures by the semiconductor processing techniques has the problems of low yield and high equipment cost, a simple preparation process having high reproducibility is demanded.

From this viewpoint, the self-ordering process, particularly the anodic oxidation process, is preferred because it can easily prepare nano-structures with high controllability, and prepare nano-structures in a large area. Particularly, the structure of anodic porous alumina formed by two-step anodic oxidation or press patterning, in which pores are regularly arranged, are preferred from the viewpoint of structural uniformity of perpendicularity, linearity, and arrangement of the pores.

SUMMARY OF THE INVENTION

In the process of studying applications of nano-structures to devices, the inventors confirmed that an arrangement of two kinds of pores having different diameters at controlled positions in a nano-structure permits expansion of the range of applications of nano-structures to devices. For example, it is expected that a material having a structure in which the dielectric constant (refractive index) periodically changes in a cycle of length near the wavelength of light produces photonic crystals, thereby permitting a high degree of light control. More specifically, a photonic band gap in which the presence of light is inhibited in a predetermined wavelength range is formed, or light is localized in a predetermined wavelength range to enable applications of non-structures to a light guide, a light emitting device, etc. One of the two kinds of pores having different diameters can be possibly used as photonic band gap regions, or regions where light is localized. In addition, in filling pores having different diameters with a magnetic material, the strength of a magnetic field required for reversing the magnetization direction possibly changes with changes in diameter of the pores. This can be possibly applied to, for example, formation of tracking tracks on a recording medium.

An example of conventional known methods of controlling the diameters of the pores of anodic porous alumina is to immerse alumina in an acidic solution (pore widening). However, this method basically controls the pores to the same diameter, and cannot control independently the diameters of the pores.

As a result of repetition of various studies in consideration of the above-described technical background, the inventors found a method for forming a nano-structure in which at least two kinds of pores having different diameters are respectively arranged at controlled positions, leading to the achievement of the present invention.

Accordingly, an object of the present invention is to provide a nano-structure having a construction for widening the range of applications to various devices, and a light emitting device, an optical device and a magnetic device using the same.

Another object of the present invention is to provide a process for preparing a nano-structure having a novel construction for widening the range of application to devices having a novel structure.

In accordance with a first aspect of the present invention, there is provided a nano-structure comprising an anodically oxidized layer, wherein the anodically oxidized layer comprises a plurality of kinds of pores.

In accordance with another aspect of the present invention, there is provided a nano-structure comprising an anodically oxidized layer containing a first pore and a second pore, wherein the diameter of the first pore is different from that of the second pore, and the first and second pores are respectively provided at controlled positions in the layer.

In accordance with still another aspect of the present invention, there is provided a light emitting device comprising a nano-structure comprising an anodically oxidized layer having a plurality of kinds of pores, wherein the pores are filled with a material having a luminescent function.

In accordance with a further aspect of the present invention, there is provided a light emitting device comprising a nano-structure comprising an anodically oxidized layer containing a first pore and a second pore having different diameters, wherein the first and second pores are respectively provided at controlled positions in the anodically oxidized layer, and at least one of the first and second pores is filled with a material having a luminescent function.

In accordance with a further aspect of the present invention, there is provided a light emitting device comprising a nano-structure comprising an anodically oxidized layer having a plurality of kinds of pores, wherein the pores are filled with a material having a refractive index different from that of the anodically oxidized layer.

In accordance with a further aspect of the present invention, there is provided a light emitting device comprising a nano-structure comprising an anodically oxidized layer containing a first pore and a second pore having different diameters, wherein the first and second pores are respectively provided at controlled positions in the anodically oxidized layer, and at least one of the first and second pores is filled with a material having a refractive index different from that of the anodically oxidized layer.

In accordance with a further aspect of the present invention, there is provided a magnetic device comprising a nano-structure comprising an anodically oxidized layer having a plurality of kinds of pores, wherein the pores are filled with a magnetic material.

In accordance with a further aspect of the present invention, there is provided a light emitting device comprising a nano-structure comprising an anodically oxidized layer containing a first pore and a second pore having different diameters, wherein the first and second pores are respectively provided at controlled positions in the anodically oxidized layer, and at least one of the first and second pores is filled with a magnetic material.

In accordance with a further aspect of the present invention, there is provided a process for preparing a nano-structure comprising an anodically oxidized layer having a plurality of kinds of pores, the process comprising the steps of preparing a film containing aluminum and having a plurality of kinds of starting points for the respective pores on a surface thereof, and anodically oxidizing the film containing aluminum, wherein the plurality of kinds of staring points are different in at least one of shape and composition.

In accordance with a further aspect of the present invention, there is provided a process for preparing a nano-structure comprising an anodically oxidized layer having first and second pores having different diameters, the process comprising the steps of preparing a film containing aluminum and having first and second starting points for the respective pores on the surface thereof, and anodically oxidizing the surface, wherein the first and second starting points are different in at least one of shape and composition.

The nano-structure having the above construction is formed by forming pore starting points at desired positions in a workpiece, and then anodically oxidizing the workpiece. In forming the pore starting points, the shape or composition of each of the pore starting points is controlled to independently control the diameters of the respective pores of anodic porous alumina. This method can realize a porous material having pores which have desired diameters and are regularly arranged at desired positions.

In the nano-structure of the present invention, the pores may be filled with a functional material such as a metal, a semiconductor, or the like to cause the possibility of application to new electronic devices.

The nano-structure of the present invention can also be used as a mold or mask to form a new nano-structure. For example, a porous material having through pores, which is obtained by removing portions of the nano-structure of the present invention other than the porous portion, can be used as a mask for deposing a functional material such as a metal, a semiconductor, or the like, or provided as an etching mask on another substrate, to form a nano-structure for quantum dots, or the like.

The nano-structure of the present invention can be used for various applications such as a quantum wire, a MIM element, a molecular sensor, coloring, a magnetic recording medium, an EL light emitting device, an electro-chromic device, an optical device such as a photonic crystal, an electron emitting device, a solar cell, a gas sensor, an abrasion resistant-insulating resistant film, a filter, etc. The nano-structure has the function to widen the range of application thereof.

Particularly, a material having a structure in which the dielectric constant periodically changes in a cycle of a length near the wavelength of light forms photonic crystals, and has the possibility of enabling a high degree of light control. More effectively, a photonic band gap appears, in which the presence of light is inhibited in a predetermined wavelength range (Photonic Crtstals, J. D. Joannopoulos, R. D. Meade, and J. N. Winn, Princeton University Press). Anodic porous alumina having a regular arrangement of pores can be used as a photonic crystal by utilizing the periodic structure thereof. In the present invention, the technique of independently controlling the diameters of pores of anodic porous alumina having regularly arranged pores permits control of the structure of a photonic crystal, control of the structure of a photonic band, and the formation of a waveguide or defects. In the photonic crystal, a localized state of light can be obtained by introducing defects, and thus a localized state of light can be obtained by locally changing the diameters of some of the pores of anodic porous alumina. This permits further application to optical recording media, and the like.

With a photonic crystal comprising a luminescent material arranged therein, a photonic band is appropriately designed according to the emission wavelength to permit control of spontaneous emission, and an improvement in performance of a light emitting device can thus be expected. Namely, the pores of the above-described anodic porous alumina are filled with a luminescent material to make it possible to expect the realization of a light emitting device with a low threshold value, a light emitting device with a narrow emission spectral width, a laser with a low threshold value, etc.

Furthermore, the pores of the anodic porous alumina are filled with a magnetic material to obtain magnetic nano-wires, and the pores of the anodic porous alumina, which have different diameters, are filled with a magnetic material to form an arrangement of magnetic fine wires having different diameters. Since the size of a magnetic fine wire affects the threshold of magnetization reversal, and domain control, magnetic resistance, etc. in a fine wire, the control of these properties enables application to magnetic devices such as a magnetic sensor, a magnetoresistive element, a magnetic recording medium, and the like.

Further objects, features and advantages of the present invention will become apparent from the following description of the preferred embodiments with reference to the attached drawings.

DESCRIPTION OF THE PREFERRED EMBODIMENT

Construction of Nano-Structure

Figure 1A:
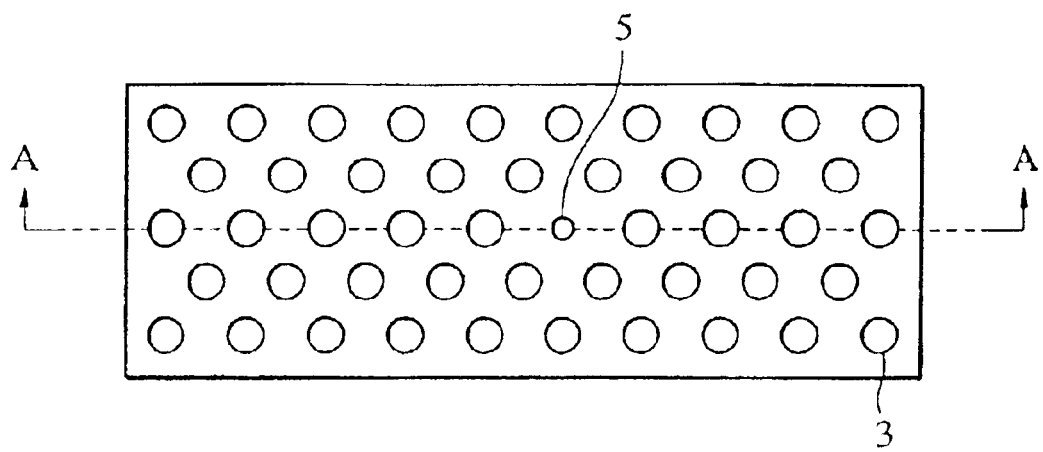
FIG. 1A is a schematic plan view of a nano-structure of the present invention.
Figure 1B:
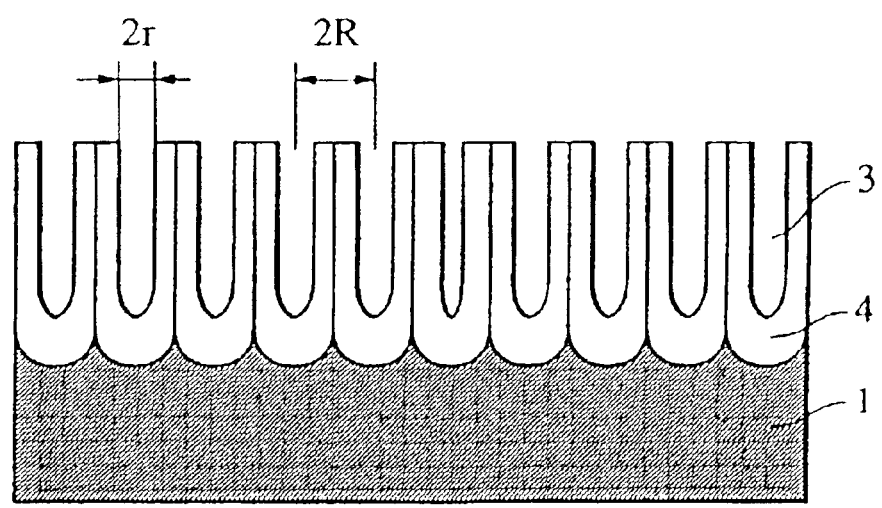
FIG. 1B is a sectional view taken along line AA in FIG. 1A.

FIG. 1 is a schematic plan view showing the construction of a nano-structure of the present invention which has two kinds of pores having different diameters. In FIG. 1, reference numeral 1 denotes a workpiece (aluminum); reference numeral 3, a first pore (nano-hole); reference numeral 4, a barrier layer. Reference numeral 5 denotes a second pore having a smaller diameter than that of the first pores 3.

This nano-structure comprises anodic porous alumina having pores and obtained by anodically oxidizing aluminum, the anodic porous alumina having at least two kinds of the pores 3 and 5 having different diameters. The pores 3 of the anodic porous alumina have a cylindrical shape, and the pores 3 and 5 can be arranged in substantially parallel at equal intervals.

Figure 2A:
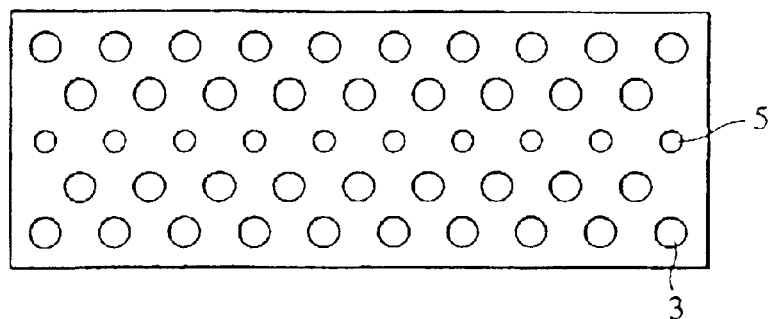
FIGS. 2A to D are schematic plan views respectively showing pore arrangements of nano-structures of the present invention.
Figure 2B:
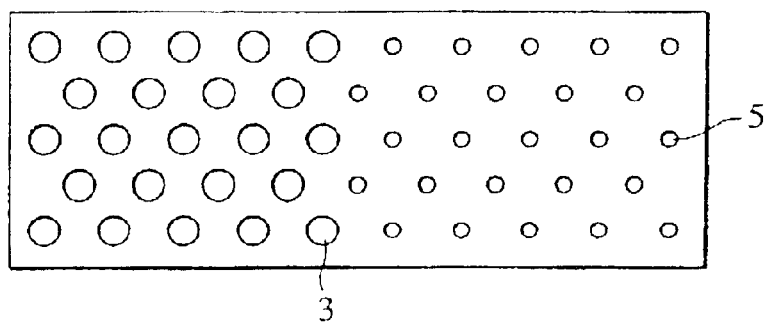
Figure 7A:
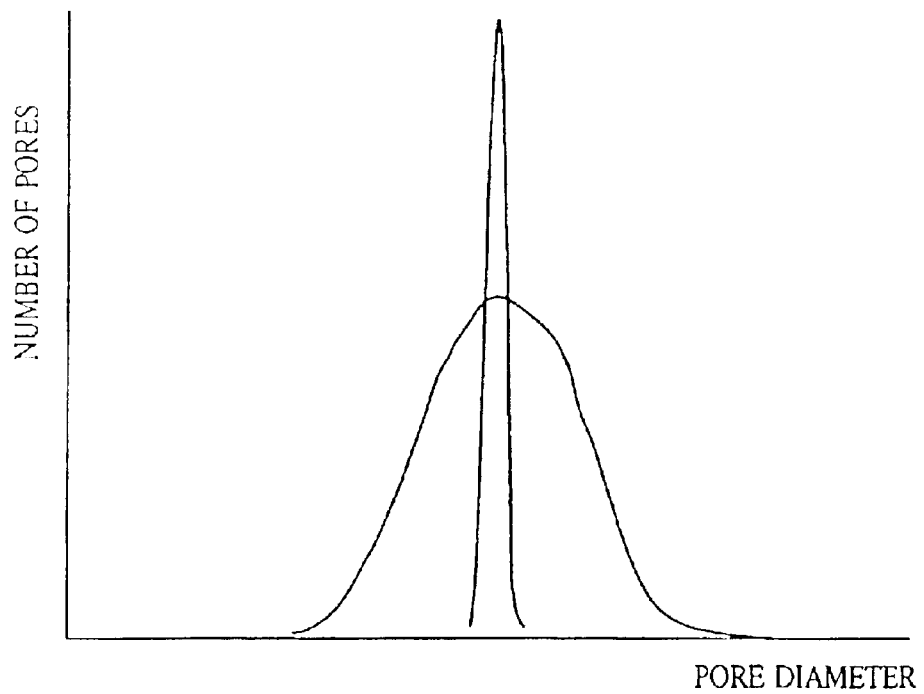
FIG. 7A is a graph showing a diameter distribution of pores present in a conventional nano-structure.
Figure 7B:
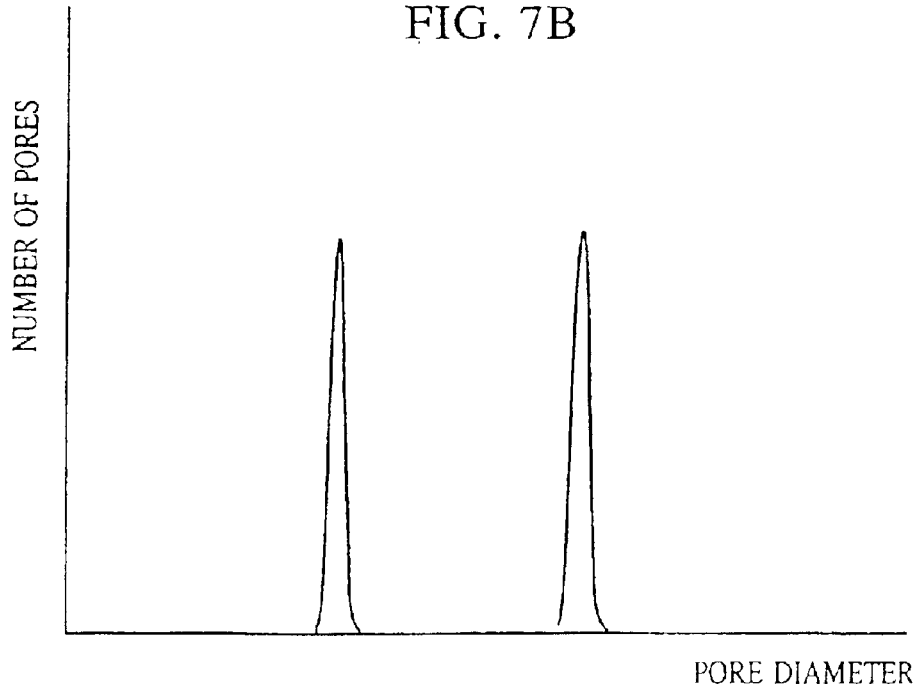
FIG. 7B is a graph showing a diameter distribution of pores present in a nano-structure of the present invention.

The presence of at least two kinds of pores having different diameters can be determined by observing a diameter distribution of the pores. For example, as shown in FIG. 7A, the diameter distribution of conventional nano-holes or regulated nano-holes has only one peak. However, the diameter distribution of two kinds of pores having different sizes in the anodic porous alumina, for example, as shown in FIG. 2A, has two peaks, as shown in FIG. 7B. By using this diameter distribution of pores, it can be decided that two kinds of pores having different diameters are present.

The diameters of the pores of the anodic porous alumina can be controlled under pore widening conditions in which the alumina is immersed in an acid solution after anodic oxidation. In the present invention, furthermore, at least one of the size and composition of pore starting points can be controlled to provide at least two kinds of pores having different diameters at predetermined positions in the anodic porous alumina. The diameters of the respective kinds of pores can be independently controlled. For example, the diameter 2r of the pores 3 is several nm to several hundreds nm, and the interval (cell size) thereof is in the range of several nm to several hundreds nm.

The positions of the pores 3 and 5 can be controlled by controlling the positions of the pore starting points. In some actual applications, there is demand for forming a nano-structure having pores at substantially equal intervals in a repetitive pattern. In this case, the pore starting points can be formed at substantially equal intervals in a repetitive pattern. Particularly, the formation of pores by anodic oxidation has the tendency that pores are formed in a triangular lattice pattern by self organization. Therefore, the pore starting points are formed in a triangular lattice pattern. In this case, since the voltage of anodic oxidation and the pore interval have a correlation, the pore starting points are also preferably set with consideration of the interval.

The depths (lengths) of the pores 3 and 5 can be controlled by controlling the anodic oxidation time, the thickness of Al, or the like, and for example, the depths are in the range of 10 nm to 100 μm.

The arrangement of at least two kinds of the pores 3 and 5 having different diameters in the anodic porous alumina is not limited to the pattern shown in FIG. 1 in which only one pore is smaller (or larger) than pores in the periphery thereof. Examples of the pattern include the pattern shown in FIG. 2A or B in which a region of pores having a different diameter is partially formed, the pattern shown in FIG. 2C in which a region of pores having a different diameter is repeated, and the pattern shown in FIG. 2D in which the diameter of pores is changed continuously or stepwisely in a predetermined direction.

Furthermore, the pores in the nano-structure can be filled with a functional material such as a metal, a semiconductor, a dielectric material, a magnetic material, or the like. Particularly, in filling a dielectric material, a dielectric material having a refractive index greatly different from that of the anodically oxidized layer is preferably used from the viewpoint of control of the photonic band. For example, a difference between the refractive indexes of the dielectric material used and the anodically oxidized layer is preferably 10% or more, more preferably 50% or more.

Process for Preparing Nano-Structure

The method of preparing the nano-structure of the present invention will be described in detail below with reference to FIG. 1. Description is made in the order of FIGS. 3A, B and C. The steps (a) to (c) below correspond to FIGS. 3A to C, respectively.

(a) Preparation of Workpiece

The workpiece 1 is prepared. The workpiece of the present invention has a portion mainly composed of aluminum.

Examples of the workpiece 1 include a bulk composed of Al as a main component, and a substrate comprising a film composed of Al as a main component. Examples of the substrate include insulator substrates such as a quartz glass substrate, and the like; semiconductor substrates such as a silicon substrate, a gallium arsenic substrate, and the like; these substrates each comprising at least one film formed thereon. The material, thickness and mechanical strength of the substrate are not limited as long as no problem occurs in formation of pores by anodic oxidation of a film composed of Al as a main component. For example, by using a substrate on which a conductive film of Ti, Nb, Pt, or Cu is formed, the uniformity of depth of the pores can be improved. As the method of depositing the film composed of Al as a main component, any desired deposition method such as resistance heating evaporation, EB deposition, sputtering, CVD, plating, or the like can be used.

The shape of the workpiece used in the present invention is not limited to a smooth plate shape, and a shape having a curved surface, a shape having irregularities or steps to some extent, and the like can be used. The shape of the workpiece is not limited as long as no problem occurs in formation of pores by anodic oxidation.

(b) Step of Forming Pore Starting Points

In this step, pore starting points 2 are formed at desired positions in the portion of the workpiece which is composed of Al as a main component. After this step, the workpiece is anodically oxidized to form pores at the desired positions, permitting control of the pore arrangement, interval, positions, directions, etc. of the nano-structure. For example, it is possible to form a nano-structure (anodic porous alumina) in which pores are regularly arranged over the entire region of a pattern with good linearity.

The pore starting points 2 can be formed by the method of applying a focused ion beam 10 (FIG. 3B), the method using SPM such as AFM and STM, the method disclosed in Japanese Patent Laid-Open No. 10-121292 in which concaves are formed by press patterning, the method of forming concaves by etching after formation of a resist pattern, or the like.

In this step, the composition or shape of the pore starting points can be controlled to control the diameter of each kind of pores 3 and 5. This can realize a nano-structure in which pores having different diameters are arrayed or arranged at controlled positions.

In the method using a focused ion beam, irradiation conditions of the ion beam such as the amount of irradiation, beam diameter, and irradiation energy of the focused ion beam, can be controlled to control the concave shape and composition of the pore starting points. This permits control of the diameters of the final nano-holes.

In the press patterning method, a pattern of press patterning can be set to a desired shape to control the depth and size of concaves of the pore starting points. This permits control of the diameters of the final nano-holes.

In the SPM method, the pressure applied to a probe on aluminum is controlled, or the shape of the probe is changed to control the shape, for example, the depth or size, of concaves of the pore starting points. Another method can also be used, in which a voltage is applied to the probe to locally oxidize the aluminum surface. In this method, the shape or composition of the pore starting points can be controlled by controlling the voltage or time.

Of these methods, the method of focused ion beam irradiation has no need for steps requiring much labor, such as resist coating, electron beam exposure, and resist removal, and the pore starting points can be formed by this method within a short time. The method also has no need to apply pressure to the workpiece, and can thus be applied to workpieces having low mechanical strength. From these viewpoints, the method of focused ion beam irradiation is preferred.

The formation of the pore starting points using the focused ion beam is described in further detail below.

The patterning positions of the aluminum surface can easily precisely be set by using an observation function attached to a focused ion beam processing apparatus. An example of the observation function is to detect secondary electrons produced by scanning the focused ion beam on a sample to obtain a scanning image. In this observation, although the focused ion beam is applied, a scanning image can be obtained even by using a weak focused ion beam. Therefore, in setting patterning positions of the workpiece, the influence of the focused ion beam irradiation can be substantially removed. By using a focused ion beam processing apparatus to which a scanning electron microscope, a laser microscope, or the like having the observation function is attached, the patterning positions of the workpiece can be set without performing focused ion beam irradiation.

Examples of the method of moving the focused ion beam irradiation position include the method of moving the focused ion beam, the method of moving the workpiece, the method comprising a combination of both methods, and the like.

Examples of ion species for the focused ion beam include liquid metal ion sources such as Ga, Si, Ge, Cs, Nb, Cu, and the like; field ionization gas ion sources such s O, N, He, Ar, and the like. However, the ion species for the focused ion beam are not limited as long as no problem occurs in formation of pores by anodic oxidation.

As the focused ion beam, an ion beam having a diameter in the range of about 5 to 1000 nm can be used. The focused ion beam has a strength distribution close to a gaussian distribution in which an irradiation size of the focused ion beam (i.e., the diameter of the focused ion beam) at each of the pore starting points preferably does not overlap with the irradiation area of the focused ion beam (i.e., the diameter of the focused ion beam) at an adjacent pore starting point.

Figure 4A:
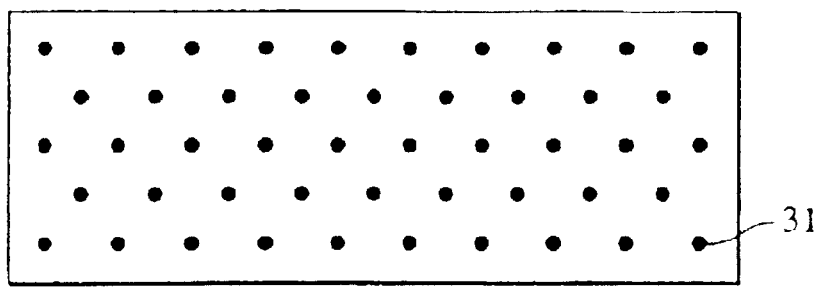
FIGS. 4A to D are schematic plan views respectively showing patterns of pore starting points.

Examples of the method of forming the pore starting points by focused ion beam irradiation of the present invention will be described with reference to FIGS. 4A to D. FIGS. 4A and C respectively show examples in which the pore starting points are formed in a substantially triangular lattice pattern, and FIGS. B and D respectively show examples in which the pore starting points are formed in a substantially square lattice pattern. Besides these examples, various other examples are conceivable, and the method of forming the pore starting points is not limited as long as no problem occurs in pore formation by anodic oxidation.

The formation of pores by anodic oxidation has the tendency that pores are formed in a substantially triangular lattice pattern by self organization. Therefore, the pore starting points are preferably formed in substantially triangular lattice pattern. This is particularly preferred when a nano-structure having deep pores is desired. However, with a nano-structure having shallow pores, the above-described self organization does not occur, and it is thus important to form the pore starting points in any desired pattern such as a substantially square lattice pattern.

In forming the pores by anodic oxidation, the interval of the pores can be controlled to some extent by controlling process conditions such as the anodic oxidation voltage applied in anodic oxidation, and thus the pore starting points are preferably formed at intervals which are predicted from the process conditions. This is particularly preferable for the case of a nano-structure having deep pores. On the other hand, for a workpiece having shallow pores, the limitation to the interval of the pore starting points defined by the process conditions is relaxed.

An example of the ion beam irradiation method comprises irradiating the workpiece with an ion beam in a dot form, as shown in FIGS. 4A and B. This method comprises repeating the step of staying the focused ion beam at an irradiation position 31 as a pore starting point, and then moving the ion beam to a next irradiation position 31 to stay it. Where the focused ion beam is desired to be moved even in spaces between dots, the time of movement in the spaces between dots is set to be shorter than the staying time at each dot position so that the influence of focus ion beam irradiation in movement in the spaces between dots can be substantially removed.

Figure 4B:
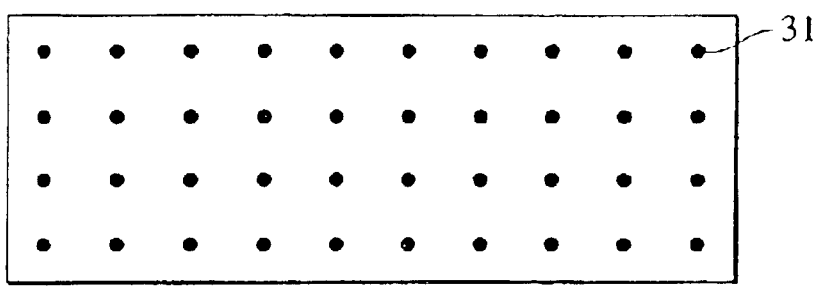
Figure 4C:
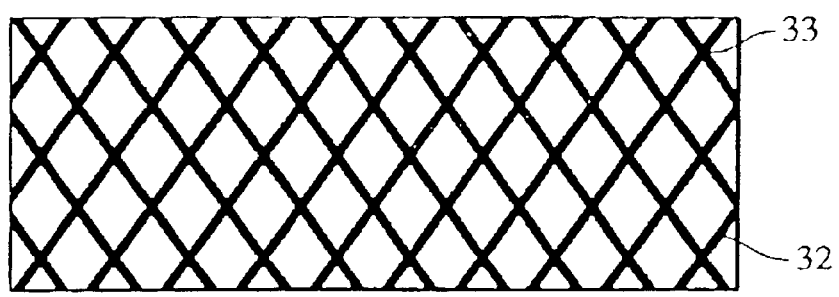
Figure 4D:
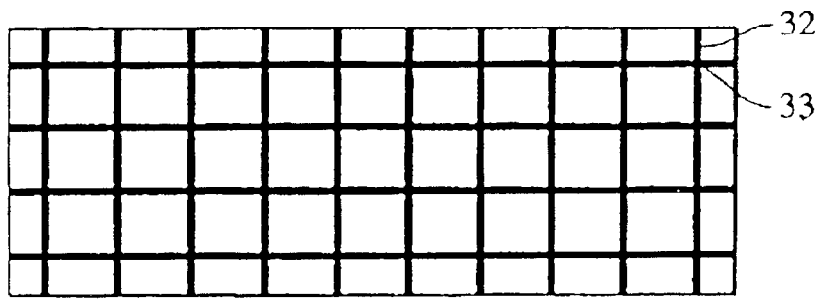

Another example of the ion beam irradiation method comprises irradiating the workpiece along parallel lines 32 in two different directions, as shown in FIGS. 4C and D. In this method, the workpiece is significantly irradiated with the focused ion beam at the intersections 33 of the lines as compared with the peripheral regions, to form the pore starting points at the intersections 33 of the lines.

By using these methods, the conditions of focused ion beam irradiation for forming the pore starting points can be controlled so that the diameter of the final nano-holes can be controlled.

The conceivable reason why the positions significantly irradiated with the focused ion beam become the pore starting points is that a state different from the peripheral regions is formed at the positions on the surface of the workpiece by ion injection or ion etching to cause specific points in anodic oxidation. As described above, the shape or composition of each of the pore starting points can be controlled by controlling the amount of ion beam irradiation, ion beam irradiation energy, beam diameter, or the like, and thus the diameter of the final nano-holes can be controlled.

(c) Step of Forming Pores

The workpiece is anodically oxidized to convert the portion composed of alumina as a main component to anodic porous alumina, to form a nano-structure. The pore starting points 2 formed in the step (b) are reflected in the formation of the pores 3 and 5.

Figure 5:
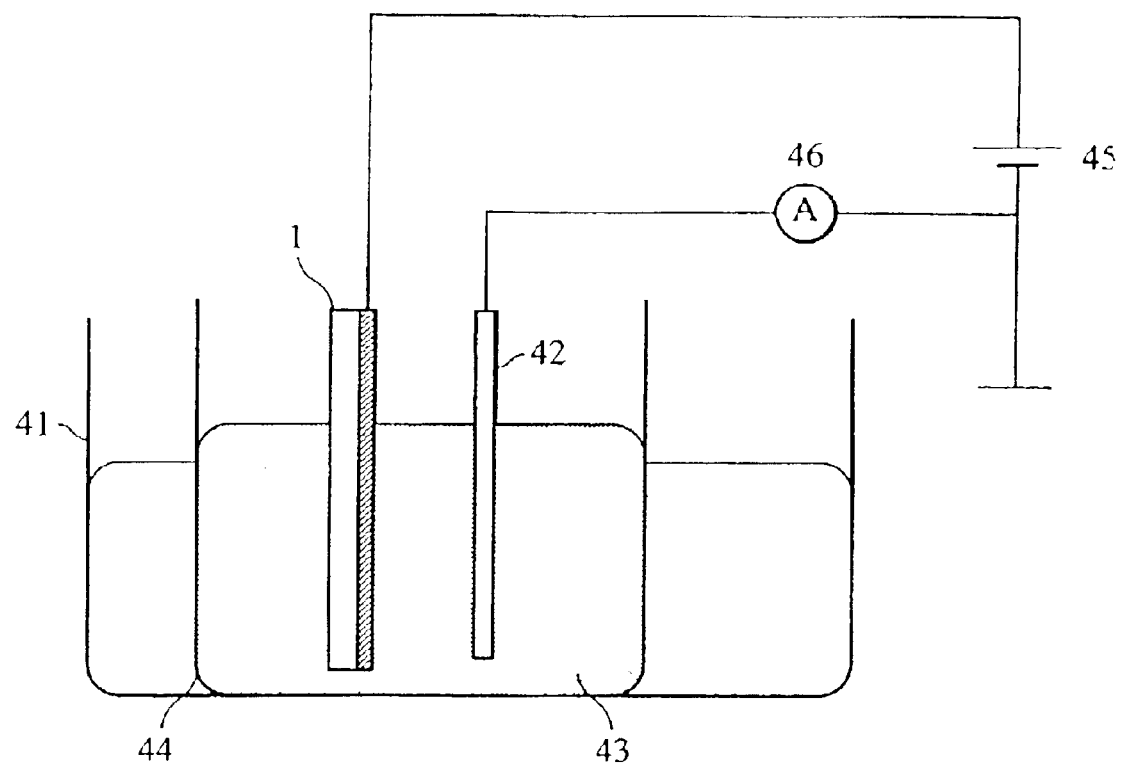
FIG. 5 is a schematic drawing of an anodic oxidation apparatus.

FIG. 5 schematically shows the anodic oxidation apparatus used in this step. In FIG. 5, reference numeral 1 denotes a workpiece; reference numeral 41, a constant-temperature bath; reference numeral 42, a cathode comprising a Pt plate; reference numeral 43, an electrolyte; reference numeral 44, a reactor; reference numeral 45, a power source for applying an anodic oxidation voltage; reference numeral 46, an ampere meter for measuring an anodic oxidation current. Although not shown in the drawing, a computer for automatically controlling and measuring the voltage and current, and the like are further provided in the apparatus.

The workpiece 1 and the cathode 42 are arranged in the electrolyte 43 kept at a constant temperature by the constant-temperature bath 41 so that a voltage is applied between the workpiece 1 and the cathode 42 from the power source 45 to effect anodic oxidation.

The electrolyte used for anodic oxidation comprises, for example, an oxalic acid solution, a phosphoric acid solution, a sulfuric acid solution, a chromic acid solution, or the like. However, the electrolyte is not limited as long as no problem occurs in formation of pores by anodic oxidation. Forming conditions such as the anodic oxidation voltage, temperature, etc. used can appropriately be set according to the nano-structure formed. Furthermore, the pores of the nano-structure can appropriately be widened by pore widening treatment in which the nano-structure is immersed in an acid solution (in the case of anodic porous alumina, a phosphoric acid solution). The acid concentration, treatment time, temperature, etc. can be controlled to obtain the nano-structure having a desired pore diameter.

As described above, the shape or composition of each of the pore starting points can be controlled to control the diameter and position of each of the pores, forming the nano-structure having at least two kinds of pores having different diameters.

In filling the pores of the nano-structure with a filler, any desired method such as electrodeposition, vacuum melting introduction, CVD, vacuum deposition, or the like can be used.

As described above, the present invention enables application of the nano-structure in various forms, thereby widening the range of application thereof.

Although the nano-structure of the present invention can be used as a functional material, the nano-structure can also be used as a master material, a mold, or the like for a new nano-structure.

In accordance with each of embodiments of the present invention, for example, the following effects can be obtained.

(1) The pore starting points are formed at desired positions of a portion containing aluminum, followed by anodic oxidation to form pores at the desired positions. Therefore, the arrangement, interval, positions, direction, etc. of the pores of the nano-structure can be controlled to prepare the nano-structure (anodic porous alumina) in which the pores are regularly arranged over the entire region of a pattern with excellent linearity. Particularly, at least one of the shape, size and composition of the pore starting points can be controlled to control the pore diameters independently. It is thus possible to realize the nano-structure in which pores having different diameters are arrayed or arranged at controlled positions.

(2) The pores of the nano-structure are filled with a material having a different refractive index to permit application as an optical material.

(3) The pores of the nano-structure are filled with a magnetic material to permit application to magnetic fine wires, a magnetic sensor, a magnetic recording medium, or the like.

(4) The pores of the nano-structure are filled with a luminescent material to realize a light emitting device with a narrow emission spectral width, a laser device with a low threshold value, or the like.

EXAMPLES

The present invention will be described below with reference to examples.

Example 1

In this example, pore starting points were formed by FIB.

a) Preparation of Workpiece

Figure 3A:
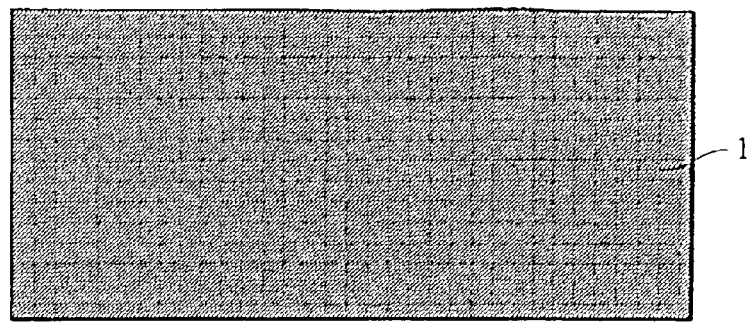
FIGS. 3A to C are drawings showing the steps of an example of a process for preparing a nano-structure of the present invention.

The surface of an Al plate having a purity of 99.99% was mirror-processed by electric field polishing in a mixed solution of perchloric acid and ethanol to prepare a workpiece, as shown in FIG. 3A.

b) Step of Forming Pore Starting Points

Figure 3B:
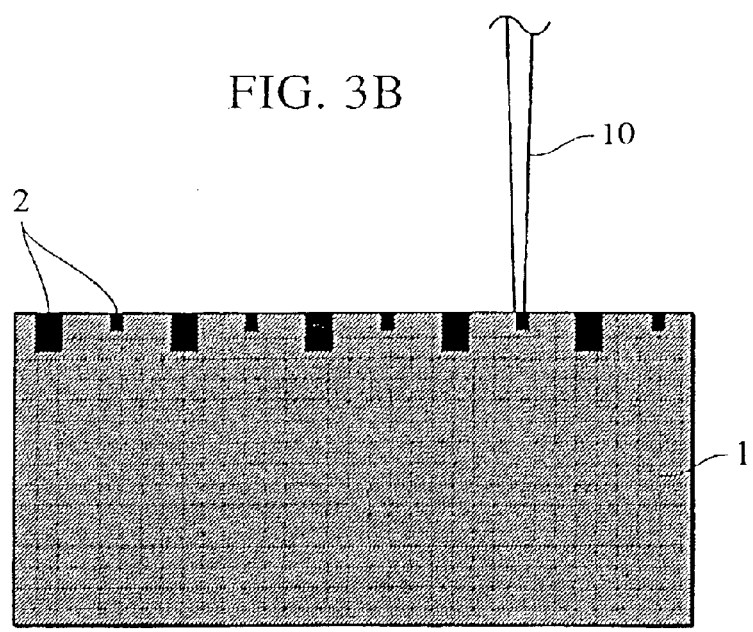
Figure 3C:
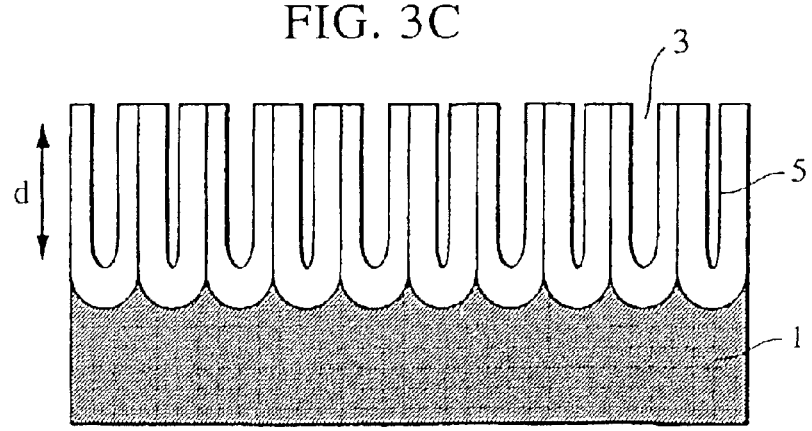

The workpiece was irradiated with a focused ion beam by using a focused ion beam processing apparatus to form pore starting points in the workpiece, as shown in FIG. 3B. In this focused ion beam processing apparatus, the ion species was Ga, and the acceleration voltage was 30 kV. First, positions where the pore starting points were formed were determined by using the secondary electron observation function attached to the focused ion beam processing apparatus. Next, the workpiece was irradiated with the focused ion beam in a dot shape to form the pore starting points at intervals of 100 nm in a substantially triangular lattice pattern, as shown in FIG. 1. At this time, the staying time of the focused ion beam at only one specific dot position was 10 msec, and the staying time at each of all other dot positions was 30 msec.

c) Step of Forming Pores

The workpiece was anodically oxidized by using the anodic oxidation apparatus shown in FIG. 5 to form pores, as shown in FIG. 1. A 0.3M oxalic acid aqueous solution used as an acid electrolyte was maintained at 3° C. by the constant-temperature bath with an anodic oxidation voltage of 40 V. Next, the workpiece after anodic oxidation was immersed in a 5 wt % phosphoric acid solution for 30 minutes to widen the pores (pore widening treatment).

Evaluation (Observation of Structure)

As a result of observation by FE-SEM (field emission scanning electron microscope), it was confirmed that the pore starting points were reflected in formation of the pores. Namely, the pores were formed to be arranged at intervals of 100 nm in a substantially triangular lattice pattern to form a nano-structure having the pores with high regularity.

The diameter of the pores (first pores) was about 50 nm at positions where the amount of ion beam irradiation in formation of the pore starting points was 30 msec, while the diameter of the pore (second pore) was about 30 nm at the peculiar dot position where the amount of ion beam irradiation in formation of the pore starting points was 10 msec.

Therefore, the pore diameter could be controlled by controlling the ion beam irradiation time (amount) as a condition for forming the pore starting points. Particularly, the thus-formed nano-structure had the pores regularly arranged, and containing the specific pore 5 having a smaller diameter than the peripheral pores and formed at a controlled position, as shown in FIG. 1.

Example 2

In this example, pore starting points were formed by the press patterning method in place of FIB.

a) Preparation of Workpiece

A workpiece was prepared according to the same procedure as Example 1.

b) Step of Forming Pore Starting Points

First, a press patterning substrate (stamper) was formed as follows, in which two kinds of convexes were periodically alternately arranged in a triangular lattice form.

First, a resist pattern was formed on a silicon substrate by using an electron beam exposure apparatus, in which two kinds of apertures having diameters of about 20 nm and 40 nm were present at intervals of about 0.1 μm in a triangular lattice form. The apertures having diameters of about 40 nm and about 20 nm were arranged in the same manner as the arrangement of large and small pores shown in FIG. 2C. Then, chromium was deposited on the resist pattern by using a deposition apparatus, and then chromium on the resist was removed together with the resist to form two kinds of convexes of chromium having diameters of about 25 nm and about 40 nm (the same height of 40 nm). Then, the silicon substrate was etched with $CF_4$ gas by a reactive dry etching process using the chromium as a mask, and the chromium was further removed by oxygen plasma to prepare a press patterning substrate in which two kinds of convexes having diameters of about 25 nm and about 40 nm and the same height of 60 nm were regularly arranged at intervals of 0.1 μm.

The press patterning substrate having the convexes formed thereon was placed on the aluminum plate prepared in step a), and a pressure of 3 ton/cm² was applied by using an oil-hydraulic press to form two kinds of pore starting points on the surface of the aluminum plate.

c) Step of Forming Pores

Anodic oxidation and pore widening treatment were carried out by the same method as Example 1.

Evaluation (Observation of Structure)

As a result of FE-SEM observation, it was confirmed that the pore starting points were reflected in formation of the pores. Namely, the pores were formed to be arranged at intervals of 100 nm in a substantially triangular lattice pattern to form a nano-structure having pores with high regularity.

Figure 2C:
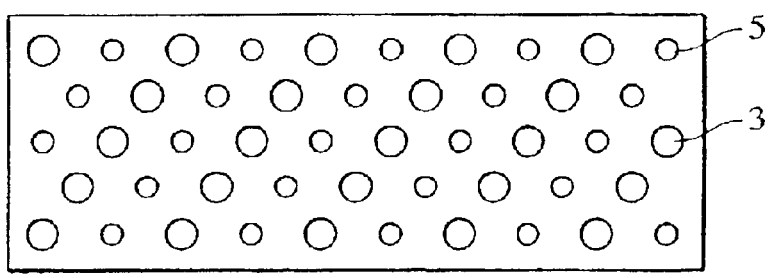
Figure 2D:
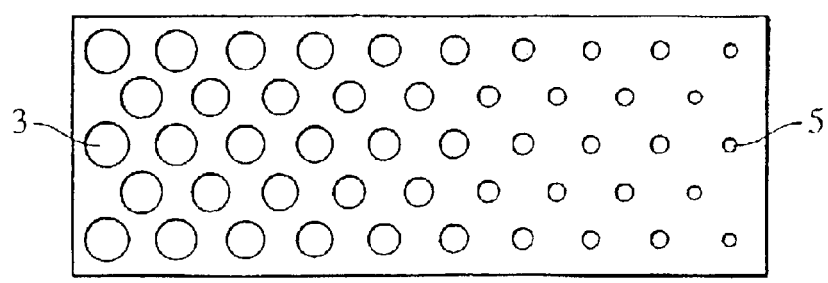

In the thus-formed nano-structure, two kinds of pores 3 and 5 having diameters of 30 nm and 50 nm were periodically arranged corresponding to the two kinds of pore starting points formed by using the convexes having diameters of 25 nm and 40 nm, as shown in FIG. 2C.

Example 3

In this example, pore starting points were formed in a square lattice form by using the FIB method.

a) Preparation of Workpiece

An Al film was deposited to a thickness of 200 nm on a quartz substrate by a resistance heating method to prepare a workpiece.

b) Step of Forming Pore Starting Points

The Al film was irradiated with a focused ion beam in a dot shape by using the focused ion beam processing apparatus to form pore starting pints at intervals of 60 nm in a substantially square lattice pattern, as shown in FIG. 4B. In the focused ion beam processing apparatus, the ion species was Ga, the acceleration voltage was 15 kV, the ion beam diameter was 30 nm, the ion current was 2 pA, and the staying time of the focused ion beam was 30 msec. However, the acceleration voltage at dots on only one line of the square lattice was 30 kV.

c) Step of Forming Pores

Anodic oxidation and pore widening treatment were carried out by the same method as Example 1 in which a 0.3M sulfuric acid aqueous solution was used as the electrolyte, and the solution was kept at 3° C. by the constant-temperature bath with an anodic oxidation voltage of 25 V.

Evaluation (Observation of Structure)

As a result of FE-SEM observation, it was confirmed that the pore starting points were reflected in formation of the pores. Namely, the pores were formed to be arranged at intervals of 60 nm in a substantially square lattice pattern to form a nano-structure having pores with high regularity.

The diameter of the pores was about 25 nm at positions where an ion acceleration voltage of 15 kV was applied in formation of the pore starting points, while the diameter of the pores was about 45 nm at positions where an ion acceleration voltage of 30 kV was applied.

Therefore, the ion acceleration voltage as a condition for forming the pore starting points was controlled to form the nano-structure in which the pores were regularly arranged, and the pores arranged in a line had a larger diameter than that of the peripheral pores.

Example 4

In this example, three kinds of pore starting points were formed by the FIB method under different irradiation conditions.

a) Preparation of Workpiece

Figure 6:
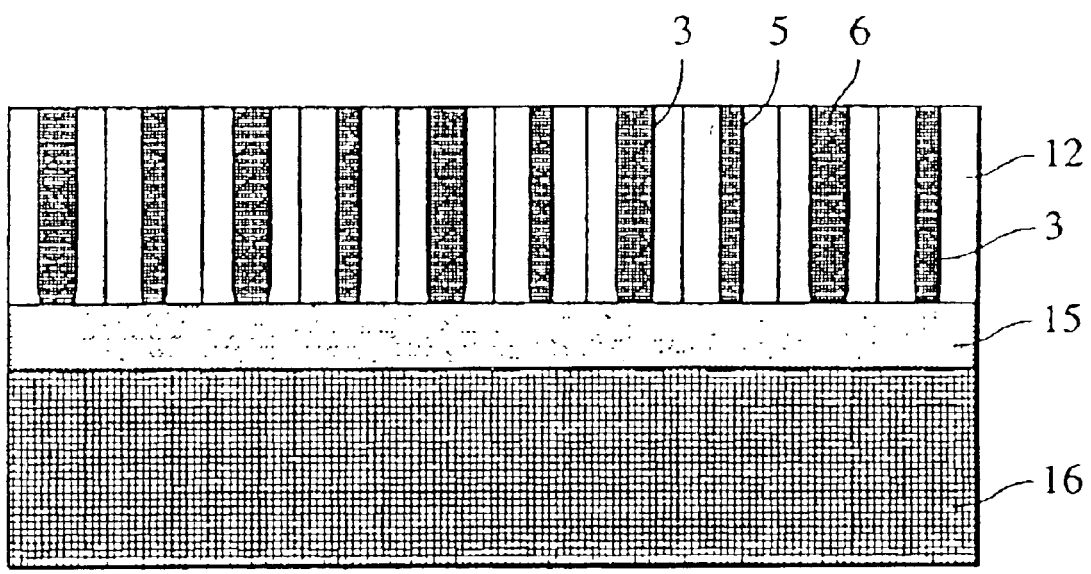
FIG. 6 is a schematic sectional view showing an example of nano-structures of the present invention in which pores are filled with a filler.

As shown in FIG. 6, a Nb film was deposited as a conductive film 15 having a thickness of 100 nm on a Si substrate 16 by the electron-beam deposition method, and then an Al film 12 of 500 nm was deposited by the sputtering method to prepare a workpiece 1.

b) Step of Forming Pore Starting Points

The Al film was linearly irradiated with a focused ion beam by using the focused ion beam processing apparatus so that substantially parallel lines were formed at intervals of 100 nm. The ion current was controlled to 1 pA and 2 pA for each line. Furthermore, the Al film was linearly irradiated with the focused ion beam in the direction at 60° with the previous lines so that the ion current was 1 pA and 2 pA for each line. The ion species of the focused ion beam was Ga, the acceleration voltage was 30 kV, and the diameter of the ion beam was 30 nm. The scan speed and the number of scans were controlled so that the total staying time of the focused ion beam at each of the intersections of the lines was 20 msec. As a result, three kinds of pore starting points respectively having different total amounts of ion irradiation of 40 f Coulomb, 60 f Coulomb, and 80 f Coulomb were formed in a triangular lattice pattern.

c) Step of Forming Pores

Anodic oxidation and pore widening treatment were carried out by the same method as Example 1 in which a 0.3M oxalic acid aqueous solution was used as the electrolyte, and the solution was kept at 3° C. by the constant-temperature bath with an anodic oxidation voltage of 45 V.

The anodic oxidation current was monitored to confirm by a decrease in the anodic oxidation current that aluminum was converted to alumina over the total thickness. Then, anodic oxidation was finished.

Evaluation (Observation of Structure)

As a result of FE-SEM (field emission scanning electron microscope) observation, it was confirmed that the pore starting points were reflected in formation of the pores. Namely, the pores were formed to be arranged at intervals of 115 nm in a substantially triangular lattice pattern to form a nano-structure having pores with high regularity.

The diameters of the pores were about 25 nm, about 40 nm, and about 50 nm corresponding to the three kinds of pore starting points where the amounts of ion irradiation in formation of the pore starting points were 40 f Coulomb, 60 f Coulomb, and 80 f Coulomb, respectively.

Therefore, the ion current in formation of the pore starting points was controlled to form the nano-structure in which three kinds of pores were regularly arranged.

Example 5

In this example, pores were filled with a magnetic material to prepare a nano-structure.

a) Preparation of Workpiece

A workpiece 1 was prepared by the same method as Example 4.

b) Step of Forming Pore Starting Points

The Al film was linearly irradiated with a focused ion beam by using the focused ion beam processing apparatus so that substantially parallel lines were formed at intervals of 100 nm. The ion current was controlled to 1 pA and 2 pA for each line. Furthermore, the Al film was linearly irradiated with the focused ion beam in the direction at 60° with the previous lines so that the ion current was 2 pA for all lines. The ion species of the focused ion beam was Ga, the acceleration voltage was 30 kV, and the diameter of the ion beam was 30 nm. The scan speed and the number of scans were controlled so that the total staying time of the focused ion beam at each of the intersections of the lines was 30 msec. As a result, two kinds of pore starting points were formed at the line intersections where the total amounts of ion irradiation were 60 f Coulomb and 90 f Coulomb.

c) Step of Forming Pores

Anodic oxidation and pore widening treatment were carried out by the same method as Example 1 in which a 0.3M oxalic acid aqueous solution was used as the electrolyte, and the solution was kept at 3° C. by the constant-temperature bath with an anodic oxidation voltage of 45 V.

The anodic oxidation current was monitored to confirm by a decrease in the anodic oxidation current that aluminum was converted to alumina over the total thickness. Then, voltage application was finished.

d) Step of Filling Pores with a Metal

Next, the pores were filled with a filler 6 by electrodeposition of Ni metal. In filling the pores with Ni, Ni was precipitated in the nano-holes by electrodeposition in which the workpiece was immersed in an electrolyte containing 0.14M NiSO$_4$ and 0.5 M H$_3$BO$_3$ together with a Ni counter electrode to precipitate Ni in the nano-holes.

Evaluation (Observation of Structure)

As a result of FE-SEM observation, the pores were filled with Ni to form magnetic nano-wires composed of Ni and having diameters of 30 nm and 50 nm according to the sizes of the large and small pores, as shown in FIG. 6. Although FIG. 6 shows a structure in which at the bottom of each of the pores, the filler directly contacts the lower conductive film 15, the structure at the bottom of each pore is not limited to this. A structure in which an insulating barrier layer 4 is formed at the bottom of each pore, a structure in which the barrier layer 4 contains a conductive pass (not shown), or the like can be used according to the material of the conductive film 15, and anodic oxidation conditions. This example has a structure in which the barrier layer is formed at the bottom of each pore, and contains a conductive pass, filler Ni (6) being electrically connected to the lower conductive film 15 through the conductive pass.

As a result of measurement of magnetic susceptibility, a two-step magnetization curve was observed. This is possibly due to the fact that the presence of two kinds of magnetic materials having different wire diameters makes the magnetization curve stepwise due to a difference in anisotropic energy. By using the property that magnetization is reversed in a magnetic field depending upon the diameters of fine wires, application to various magnetic devices can be expected.

Example 6

In this example, pores were filled with a layered film comprising a magnetic material and a nonmagnetic material to form a nano-structure.

In this example, alumina nano-holes were formed by the same anodic oxidation as Example 5, and then filled with a lamination of metals. The lower conductive film 15 (FIG. 6) was composed of Pt.

After the pores were formed, a sample was immersed in an electrolyte comprising 0.5M of cobalt sulfate and 0.001M copper sulfate together with a platinum counter electrode, with voltages 0.2 V and 0.9 V alternately applied for 1 second and 15 seconds, respectively, to grow Co and Cu layers at the bottom of each nano-hole. In this step, only Cu as a low-concentration ion was electro-deposited with a voltage of 0.2 V applied, and a high concentration of Co was mainly electro-deposited with a voltage of 0.9 V applied to form a layered film. This example has a structure in which the filler at the bottom of each pore directly contacts the lower conductive film 15, as shown in FIG. 6, so that the lower conductive film 15 is electrically connected to the layered film 6 of Co and Cu.

An electrode was attached to the upper portion of the nano-structure of the present invention to examine the magnetic field dependency of resistance between the upper portion of the filler and the lower layer. As a result, stepwise negative magnetic resistance was observed. This is possibly due to the fact that the layered film deposited in each of the pores exhibits a GMR effect. It is thus found that the nano-structure of this example can be used for a magnetic sensor.

Example 7 a) A Workpiece was Prepared According to the Same Procedure as Example 1 b) Step of Forming Pore Starting Points

Pore starting points were formed by the same method as Example 5. The interval of the pore starting points was 200 nm.

c) Step of Forming Pores

Anodic oxidation and pore widening treatment were carried out by the same method as Example 1 in which a 0.3M phosphoric acid aqueous solution was used as the electrolyte, and the solution was kept at 3° C. by the constant-temperature bath with an anodic oxidation voltage of 80 V.

As a result of measurement of a transmission spectrum of anodic porous alumina isolated by dissolving with silver chloride, a decrease in transmittance was observed at a wavelength from 500 nm to 600 nm. This indicated that the anodic porous alumina exhibit properties as a photonic crystal. It was thus found that the nano-structure of the present invention can be used for an optical device.

Example 8

In this example, regular anodic porous alumina was formed, and pores were filled with an oxide.

Anodic porous alumina was formed on Pt by the same method as Example 6. However, the interval of pore starting points was 160 nm, a 5 wt % phosphoric acid solution was used as an electrolyte for anodic oxidation, and the voltage was set to 65 V.

After the step of forming pores, a sample as immersed in a 0.1M zinc nitride aqueous solution kept at 60° C. together with a platinum counter electrode, and a voltage of 0.8 V based on a Ag/AgCl standard electrode was applied to grow ZnO crystals in the pores.

As a result of FE-SEM observation, it was found that the pores were regularly arranged, and ZnO was grown in the pores.

As a comparative example, ZnO was deposited on Pt without nano-holes under the same conditions.

As a result of irradiation of the nano-structure of the present invention with He-Cd laser (wavelength 325 nm), strong light emission with a narrow spectral width was observed at a wavelength of near 390 nm, as compared with the comparative example.

The results of this example reveal that the pores of anodic porous alumina can be filled with a luminescent material (ZnO). It was also found that filling pores with a luminescent material permits application to optical devices.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A process for preparing a nano-structure comprising an anodically oxidized layer comprising first and second pores having different diameters, the process comprising the steps of:

(a) preparing a film containing aluminum and having predetermined first and second starting points for the respective pores on the surface of the film, wherein the predetermined first and second starting points are different from each other in at least one of shape and composition; and (b) anodically oxidizing the surface of the film.

2. A process for preparing a nano-structure according to claim 1, wherein the predetermined first and second starting points comprise concaves having different shapes.

3. A process for preparing a nano-structure according to claim 1, wherein the predetermined first and second starting points comprise concaves having different depths.

4. A process for preparing a nano-structure according to claim 1, wherein the step (a) comprises the sub-step of irradiating the surface of the film with a focused ion beam under irradiation conditions.

5. A process for preparing a nano-structure according to claim 1, wherein the step (a) comprises the sub-step of irradiating the surface of the film with a focused ion beam with changing amounts of irradiation.

6. A process for preparing a nano-structure according to claim 1, wherein the step (a) comprises the sub-step of irradiating the surface of the film with a focused ion beam with changing beam diameters.

7. A process for preparing a nano-structure according to claim 1, wherein the step (a) comprises the sub-step of irradiating the surface of the film with a focused ion beam with changing irradiation energy.

8. A process for preparing a nano-structure comprising an anodically oxidized layer having pores of different diameters, the process comprising the steps of:
(a) preparing a film having different kinds of predetermined starting points on the surface of the film,
wherein the different kinds of predetermined starting points differ in at least one of shape and composition; and
(b) anodically oxidizing the film to form the pores of different diameters from the different kinds of predetermined starting points.

9. A process for preparing a nano-structure according to claim 8, wherein the different kinds of predetermined starting points have concaves having different shapes.

10. A process for preparing a nano-structure according to claim 8, wherein the different kinds of predetermined starting points have concaves having different depths.

11. A process for preparing a nano-structure according to claim 8, wherein the step (a) comprises the sub-step of irradiating the surface of the film with a focused ion beam.

12. A process for preparing a nano-structure according to claim 11, wherein the step (a) comprises the sub-step of irradiating the surface of the film with a focused ion beam with an amount of irradiation changing with the different kinds of predetermined starting points.

13. A process for preparing a nano-structure according to claim 11, wherein the step (a) comprises the sub-step of irradiating the surface of the film with a focused ion beam with a beam diameter changing with the different kinds of predetermined starting points.

14. A process for preparing a nano-structure according to claim 11, wherein the step (a) comprises the sub-step of irradiating the surface of the film with a focused ion beam with irradiation energy changing with the different kinds of predetermined starting points.

* * * * *